(12) United States Patent
Zhuang et al.

(10) Patent No.: US 10,116,317 B1
(45) Date of Patent: Oct. 30, 2018

(54) SIGNAL GENERATOR WITH SELF-CALIBRATION

(71) Applicant: Iowa State University Research Foundation, Inc., Ames, IA (US)

(72) Inventors: Yuming Zhuang, Ames, IA (US); Degang Chen, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 15/813,977

(22) Filed: Nov. 15, 2017

(51) Int. Cl.
*H03M 1/10* (2006.01)
*H03M 1/66* (2006.01)

(52) U.S. Cl.
CPC .......... *H03M 1/1009* (2013.01); *H03M 1/66* (2013.01)

(58) Field of Classification Search
CPC ............................. H03M 1/66; H03M 1/1009
USPC .................................................. 341/118–144
See application file for complete search history.

(56) References Cited

U.S. PATENT DOCUMENTS

| | | | |
|---|---|---|---|
| 3,579,081 A | 5/1971 | Bates | |
| 3,657,657 A | 4/1972 | Jefferson | |
| 4,746,879 A * | 5/1988 | Ma | H03L 1/025 331/116 FE |
| 4,910,698 A | 3/1990 | McCartney | |
| 5,287,233 A * | 2/1994 | Lee | G11B 15/026 360/71 |
| 5,604,465 A * | 2/1997 | Farabaugh | H03J 1/0008 331/10 |
| 5,684,850 A * | 11/1997 | Warburton | G01T 1/171 378/53 |
| 6,429,796 B1 | 8/2002 | Buckley | |
| 8,255,183 B1 * | 8/2012 | Husted | H04B 17/0085 702/117 |
| 9,397,677 B1 * | 7/2016 | Abramzon | H03M 1/1033 |
| 9,543,974 B1 * | 1/2017 | Yang | H03M 1/066 |
| 9,762,256 B2 * | 9/2017 | Chandra | H03M 1/066 |
| 9,813,071 B1 * | 11/2017 | An | H03M 1/0617 |
| 2004/0080444 A1 * | 4/2004 | Meyers | H03M 1/366 341/159 |
| 2008/0109504 A1 | 5/2008 | McDonald | |

(Continued)

OTHER PUBLICATIONS

Abe, F, et al., "Low-Distortion Signal Generation for ADC Testing," 2014 IEEE International Test Conference (ITC), Oct. 20-23, 2014, Seattle, Washington, USA, 10 pages.

(Continued)

*Primary Examiner* — Lam T Mai
(74) *Attorney, Agent, or Firm* — Withrow & Terranova, P.L.L.C.

(57) ABSTRACT

The present disclosure relates to a signal generator with self-calibration including a main digital-to-analog converter (DAC), a calibration DAC, a summing buffer structure, a two-path filter structure, an analog-to-digital converter (ADC), and a control system. The main DAC provides a main DAC output signal with main DAC distortion. The main DAC output signal is calibrated by a calibration DAC output signal to correct at least a portion of the main DAC distortion. The calibration DAC output signal includes information about the main DAC distortion and is generated by a feedback loop including the summing buffer structure, the two-path filter structure, the filter buffer, the ADC, the control system, and the calibration DAC.

27 Claims, 2 Drawing Sheets

(56) References Cited

U.S. PATENT DOCUMENTS

Figure 1:
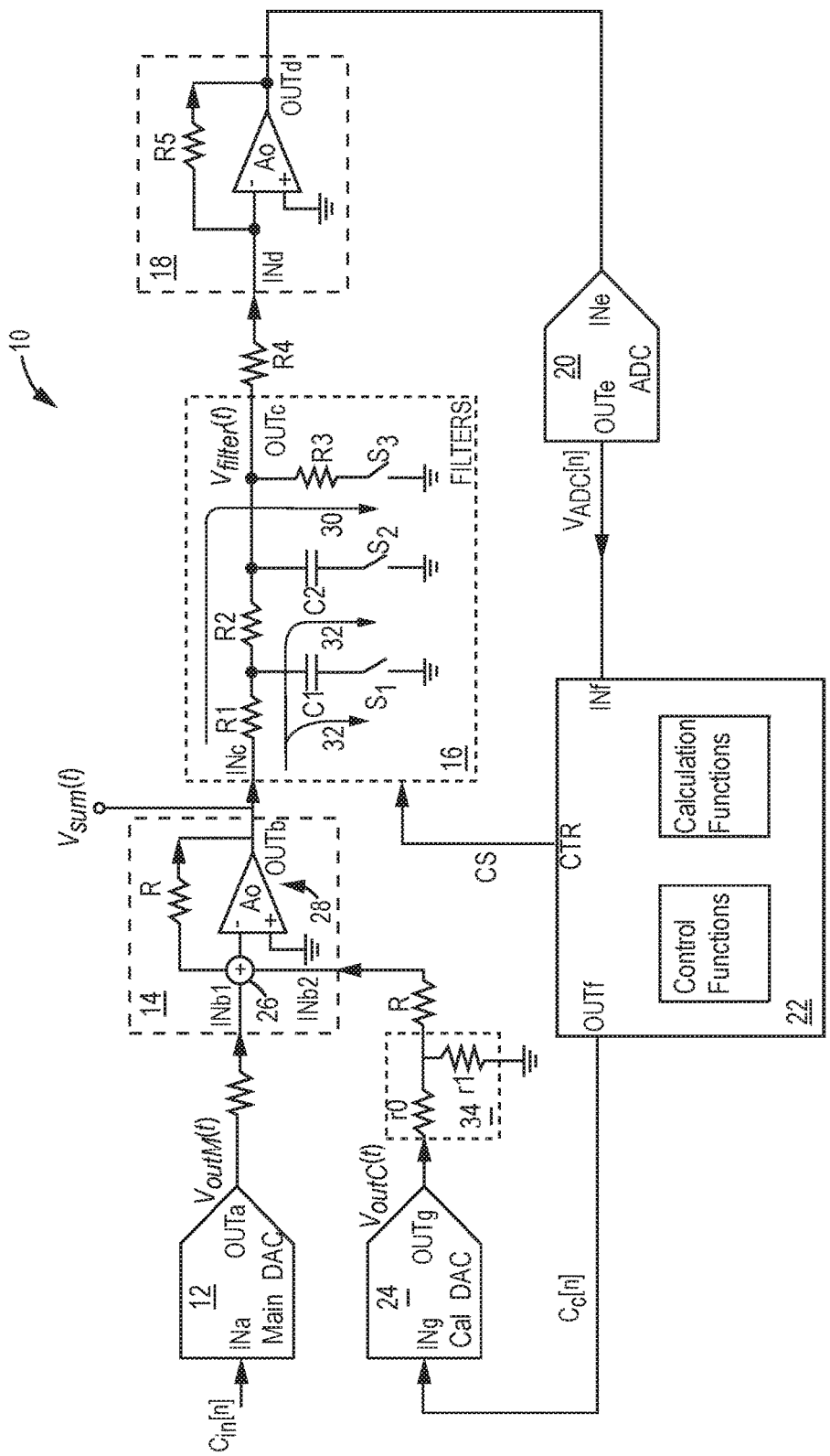

| | | | |
|---|---|---|---|
| 2008/0165040 A1* | 7/2008 | Rotchford | H03M 1/1047 341/120 |
| 2013/0234871 A1* | 9/2013 | Eliezer | H03M 1/1009 341/120 |
| 2016/0308545 A1* | 10/2016 | Chandra | H03M 1/066 |

OTHER PUBLICATIONS

Elsayed, M. M., et al., "A Low THD, Low Power, High Output-Swing Time-Mode-Based Tunable Oscillator Via Digital Harmonic-Cancellation Technique," IEEE Journal of Solid-State Circuits, vol. 45, No. 5, May 2010, pp. 1061-1071.

Maeda, A., "A Method to Generate a Very Low Distortion, High Frequency Sine Waveform Using an AWG," 2008 IEEE International Test Conference (ITC), Oct. 28-30, 2008, Santa Clara, California, USA, 8 pages.

Rabijns, D., et al., "Spectrally Pure Excitation Signals: Only a Dream?" IEEE Transactions on Instrumentation and Measurement, vol. 53, No. 5, Oct. 2004, pp. 1433-1440.

Vasan, B. K., et al., "Low-Distortion Sine Wave Generation Using a Novel Harmonic Cancellation Technique," IEEE Transactions on Circuits and Systems—I: Regular Papers, vol. 60, No. 5, May 2013, pp. 1122-1134.

Zhuang, Y., et al., "Low Cost Ultra-Pure Sine Wave Generation with Self Calibration," 2016 IEEE International Test conference (ITC), Nov. 15-17, 2016, Fort Worth, Texas, USA, 9 pages.

Sudani, Siva, et al., "Accurate spectral test algorithms with relaxed instrumentation requirements," Graduate Theses and Dissertations, Iowa State University, 2013, 170 pages.

Sudani, Siva, et al., "A Novel Robust and Accurate Spectral Testing Method for Non-coherent Sampling," International Test Conference, Sep. 2011, Anaheim, California, IEEE, 10 pages.

Sudani, Siva, et al., "FIRE: A Fundamental Identification and Replacement Method for Accurate Spectral Test without Requiring Coherency," IEEE Transactions on Instrumentation and Measurement, vol. 62, Issue 11, Nov. 2013, IEEE, pp. 3015-3025.

Zhuang, Yuming, et al., "Accurate Spectral Testing with Non-coherent Sampling for Large Distortion to Noise Ratios," VLSI Test Symposium, Apr. 2016, Las Vegas, Nevada, IEEE Computer Society, 6 pages.

\* cited by examiner

SIGNAL GENERATOR WITH SELF-CALIBRATION

FIELD OF THE DISCLOSURE

The present disclosure relates to a signal generator, and more particularly to a signal generator with self-calibration.

BACKGROUND

Data converters play a crucial rule in the electronics field as they bridge the analog world to the digital domain and vice versa in modern integrated circuits (ICs). Over the last decades, significant progress has been achieved in designing high resolution analog-to-digital converters (ADCs) and digital-to-analog converters (DACs). In order to characterize such sophisticated data converters, especially ADCs, spectral testing is now widely utilized. The spectral testing normally requires an input signal to the tested ADC having 3 to 4 bits more purity than the tested ADC itself. When the resolution of the ADC is high, for instance a 16-bit, it is very challenging (sophisticated circuitry design, and or complicated calibration) and costly to achieve a pure enough input signal. If the input signal does not meet the high purity requirement, the ADC output spectrum will no longer contain just ADC nonlinearity, but will also contain nonlinearity from the input signal. The ADC's specifications, such as total harmonic distortion (THD) and spurious free dynamic range (SFDR), cannot be accurately obtained from the output spectrum.

Accordingly, there remains a need for an improved signal generator design that provides ultra-pure sinusoidal/cosinusoidal signals with an easy implementation at a low cost.

SUMMARY

The present disclosure relates to a signal generator with self-calibration. The disclosed signal generator includes a main digital-to-analog converter (DAC), a calibration DAC, a summing buffer structure, a two-path filter structure, an analog-to-digital converter (ADC), and a control system. The main DAC provides a main DAC output signal with main DAC distortion. The calibration DAC provides a calibration DAC output signal, which includes information about the main DAC distortion. The summing buffer structure is configured to sum the main DAC output signal and the calibration DAC output signal and provide a summing output signal, which corrects at least a portion of the main DAC distortion. The two-path filter structure includes a first filter path and a second filter path. When the first filter path is conducted, the two-path structure is configured to provide a first filter output signal based on the summing output signal. When the second filter path is conducted, the two-path structure is configured to provide a second filter output signal based on the summing output signal. The ADC provides a first ADC output signal based on the first filter output signal and provides a second ADC output signal based on the second filter output signal. The control system is coupled between the ADC and the calibration DAC and configured to provide a calibration DAC input signal to the calibration DAC to update the calibration DAC output signal. Herein, the calibration DAC input signal is calculated from the first ADC output signal and the second ADC output signal. The updated calibration DAC output signal includes updated information about the main DAC distortion.

In one embodiment of the signal generator, the summing output signal corrects at least 95% of the main DAC distortion.

In one embodiment of the signal generator, the control system includes at least one of a group consisting of a microcontroller, application specific integrated circuit (ASIC), and a computer.

In one embodiment of the signal generator, the control system is embedded in a same printed circuit board (PCB) as the main DAC, the ADC, and the calibration DAC.

In one embodiment of the signal generator, the control system is off a PCB board, in which the main DAC, the ADC, and the calibration are embedded.

In one embodiment of the signal generator, the control system includes a first portion and a second portion. The first portion of the control system is embedded in a same PCB as the main DAC, the ADC, and the calibration DAC. The second portion of the control system is off the PCB board.

In one embodiment of the signal generator, the control system is configured to selectively conduct the first filter path and the second filter path.

In one embodiment of the signal generator, the summing buffer structure includes a summing unit and an operational amplifier (op-amp) buffer coupled to the summing unit. Herein, the summing unit is configured to receive the main DAC output signal and the calibration DAC output signal and the op-amp buffer is configured to provide the summing output signal.

According to another embodiment, the signal generator further includes a filter buffer coupled between the two-path filter structure and the ADC.

In one embodiment of the signal generator, the filter buffer is an op-amp buffer.

In one embodiment of the signal generator, the first filter path includes a low-pass filter and the second filter path includes a signal attenuator.

In one embodiment of the signal generator, the signal attenuator is frequency independent.

In one embodiment of the signal generator, the signal attenuator is frequency dependent.

In one embodiment of the signal generator, the first filter path includes a first signal attenuator and the second filter path includes a second signal attenuator. The first signal attenuator and the second signal attenuator are different.

In one embodiment of the signal generator, the first filter path includes a first low-pass filter and the second filter path includes a second low-pass filter. The first low-pass filter and the second low-pass filter are different.

In one embodiment of the signal generator, the first low-pass filter and the second low-pass filter have a same order.

In one embodiment of the signal generator, the first low-pass filter and the second low-pass filter have different orders.

According to another embodiment, the signal generator further includes a signal attenuator coupled between the calibration DAC and the summing buffer structure.

In one embodiment of the signal generator, the signal attenuator is a voltage divider.

In one embodiment of the signal generator, the main DAC, the calibration DAC, and the ADC have a same resolution.

In one embodiment of the signal generator, the main DAC, the calibration DAC, and the ADC have different resolutions.

According to an exemplary operation process for generating a high purity-level signal, a main digital-to-analog converter (DAC) output signal, which has main DAC distortion, is generated by a main DAC. A summing output signal is then generated by a summing buffer structure. The summing output signal is generated based on the main DAC output signal and a calibration DAC output signal that equals zero. Next, a first filter output signal and a second filter output signal are generated sequentially by a two-path filter structure that includes a first filter path and a second filter path. Herein, the first filter output signal is generated when the first filter path is conducted, and the second filter output signal is generated when the second filter path is conducted. A first analog-to-digital converter (ADC) output signal and a second ADC output signal by an ADC are generated sequentially by an ADC and based on the first filter output signal and the second filter output signal, respectively. Each of the first ADC output signal and the second ADC output signal includes both the main DAC distortion and ADC distortion from the ADC. After the first ADC output signal and the second ADC output signal are generated, a calibration DAC input signal is generated by a control system. The calibration DAC input signal includes information about the main DAC distortion. Next, the calibration DAC output signal is updated by the calibration DAC and based on the calibration DAC input signal. Finally, the main DAC output signal is calibrated with the updated calibration DAC output signal, so as to correct at least a portion of the main DAC distortion.

In one embodiment of the exemplary operation process, generating the calibration DAC input signal is provided by separating the main DAC distortion and the ADC distortion based on the first ADC output signal and the second ADC output signal, and calculating the calibration DAC input signal based on the main DAC distortion.

In one embodiment of the exemplary operation process, the main DAC output signal and the updated calibration DAC output signal have inverted phases.

According to another embodiment, the exemplary operation process further includes selectively conducting the first filter path and the second filter path by the control system.

In one embodiment of the exemplary operation process, generating the calibration DAC input signal is implemented by a first portion of the control system, which is a microcontroller embedded in a same PCB as the main DAC, the ADC, and the calibration DAC.

In one embodiment of the exemplary operation process, generating the calibration DAC input signal is implemented by a first portion of the control system, which is a computer off a PCB that the main DAC, the ADC, and the calibration are embedded in.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an exemplary signal generator according to one embodiment of the present disclosure.

Figure 2:
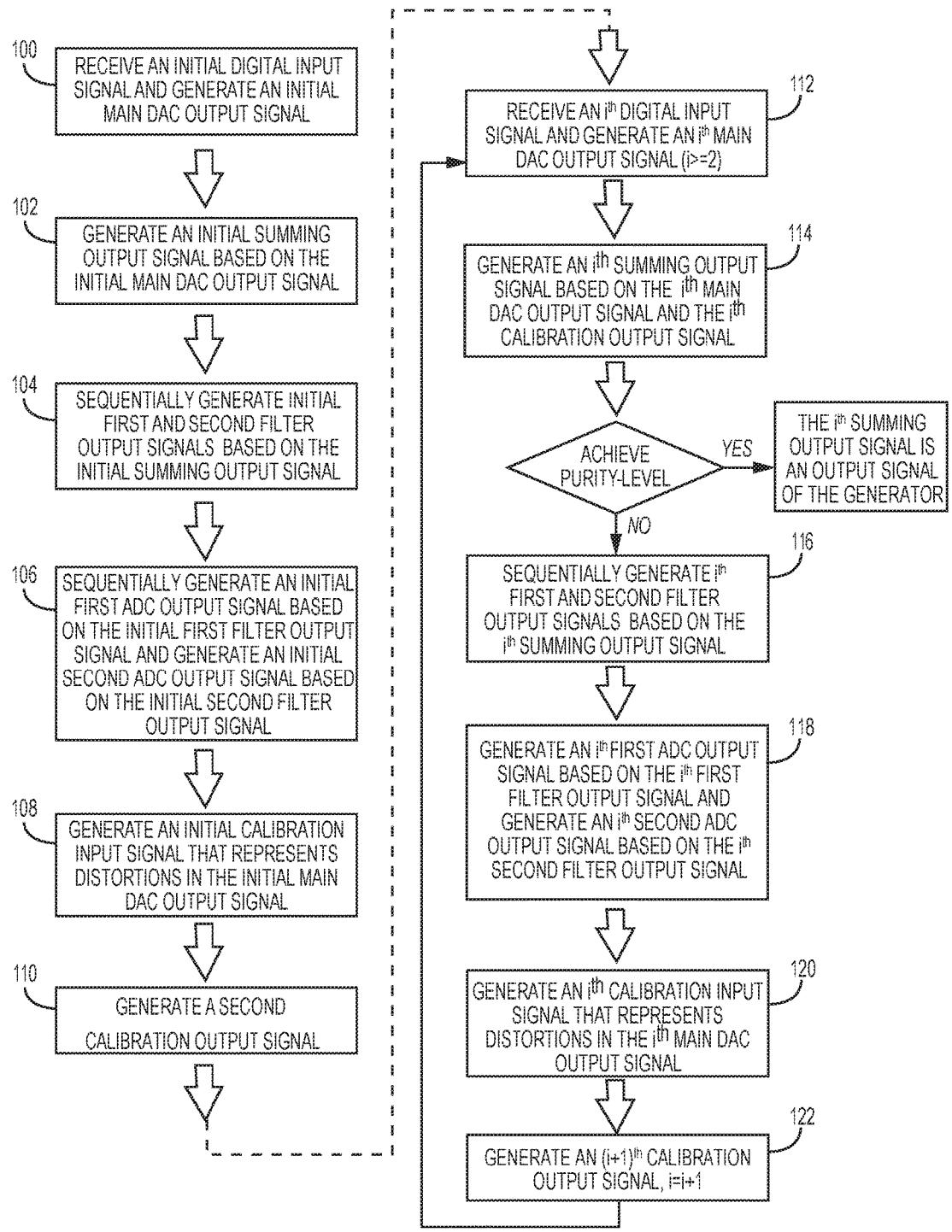

FIG. 2 provides a flow diagram that illustrates an exemplary operation process to generate a high purity-level signal by the signal generator illustrated in FIG. 1.

It will be understood that for clear illustrations, FIGS. 1-2 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a signal generator with self-calibration. FIG. 1 shows an exemplary signal generator 10 according to one embodiment of the present disclosure and FIG. 2 provides a flow diagram that illustrates an exemplary operation process to generate a high purity-level signal by the signal generator 10 illustrated in FIG. 1. The RF signal generator 10 includes a main digital-to-analog converter (DAC) 12, a summing buffer structure 14, a two-path filter structure 16, a filter buffer 18, an analog-to-digital converter (ADC) 20, a control system 22, and a calibration DAC 24. In different applications, the main DAC 12, the ADC 20, and the calibration DAC 24 may have a same resolution or different resolutions.

Herein, the main DAC 12 has an input terminal INa and an output terminal OUTa; the summing buffer structure 14 has a first input terminal INb1, a second input terminal INb2 and an output terminal OUTb; the two-path filter structure 16 has an input terminal INc and an output terminal OUTc; the filter buffer 18 has an input terminal INd and an output terminal OUTd; the ADC 20 has an input terminal INe and an output terminal OUTe; the control system 22 has an input terminal INf, an output terminal OUTf, and a control terminal CTR; and the calibration DAC 24 has an input terminal INg and an output terminal OUTg. The output terminal OUTa of the main DAC 12 is coupled to the first input terminal INb1 of the summing buffer structure 14 and the output terminal OUTg of the calibration DAC 24 is coupled to the second input terminal INb2 of the summing buffer structure 14. The input terminal INc of the two-path filter structure 16 is coupled to the output terminal OUTb of the summing buffer structure 14 and the output terminal OUTc of the two-path filter structure 16 is coupled to the input terminal INd of the filter buffer 18. The input terminal INe of the ADC 20 is coupled to the output terminal OUTd of the filter buffer 18 and the output terminal OUTe of the ADC 20 is coupled to the input terminal INf of the control system 22. The output terminal OUTf of the control system 22 is coupled to the input terminal INg of the calibration DAC 24.

The main DAC 12 is configured to provide a main DAC output signal $V_{outM}(t)$, which normally has distortion. The main DAC output signal $V_{outM}(t)$ with distortion may be calibrated by a calibration DAC output signal $V_{outC}(t)$ generated from a feedback loop including the summing buffer structure 14, the two-path filter structure 16, the filter buffer 18, the ADC 20, the control system 22, and the calibration DAC 24. Herein, the calibration DAC output signal $V_{outC}(t)$ includes distortion information in the main DAC output signal $V_{outM}(t)$ and normally has an inverted phase (180° difference) to the main DAC output signal $V_{outM}(t)$. The summing buffer structure 14 sums the main DAC output signal $V_{outM}(t)$ and the calibration DAC output signal $V_{outC}(t)$ to provide a summing output signal $V_{sum}(t)$ at the output terminal OUTb of the summing buffer structure 14, such that the summing output signal $V_{sum}(t)$ corrects at least a portion of the distortion included in the main DAC output signal $V_{outM}(t)$. Therefore, the summing output signal $V_{sum}(t)$ has a higher purity level than the main DAC output signal $V_{outM}(t)$. After a number of calibration iterations (more details are described later), the summing output signal $V_{sum}(t)$ may correct substantially all distortion in the main DAC output signal $V_{outM}(t)$ and may be used as a high-purity output signal of the signal generator 10.

At initial calibration iteration, the main DAC 12 receives an initial digital input signal $C_{in(1)}[n]$ at the input terminal INa of the main DAC 12 and generates an initial main DAC output signal $V_{outM(1)}(t)$ at the output terminal OUTa of the main DAC 12 (step 100). The initial digital input signal $C_{in(1)}[n]$ is an ideal digital sinusoidal/cosinusoidal signal with essentially no noise or distortion. The initial main DAC output signal $V_{outM(1)}(t)$, however, includes the distortion from the main DAC 12. At the initial calibration iteration, the calibration DAC 24 is turned off and an initial calibration DAC output signal $V_{outC(1)}(t)$ equals zero. See mathematic details in Section A below.

The summing buffer structure 14 then provides an initial summing output signal $V_{sum(1)}(t)$ based on the initial main DAC output signal $V_{outM(1)}(t)$ (step 102). The initial summing output signal $V_{sum(1)}(t)$ does not correct the distortion in the initial main DAC output signal $V_{outM(1)}(t)$, because the calibration DAC 24 is turned off at the initial calibration iteration. See mathematic details in Section A below. Next, the two-path filter structure 16 sequentially generates an initial first filter output signal $V_{Filter1(1)}(t)$ and an initial second filter output signal $V_{Filter2(1)}(t)$ based on the initial summing output signal $V_{sum(1)}(t)$ (step 104). The two-path filter structure 16 has a first filter path 30 and a second filter path 32, which are selectively conducted by a control signal CS provided by the control system 22 at the control terminal CTR. In this embodiment, the first filter path 30 includes a signal attenuator, like a voltage divider (R1, R2, and R3) and the second filter path 32 includes a second order low-pass filter (R1, R2, C1, and C2). In different applications, the signal attenuator within the first filter path 30 may or may not be frequency dependent. The second filter path 32 may include a lower order or high order low-pass filter to adjust filter responses according to a filter input frequency (herein the filter input frequency is the frequency of the initial summing output signal $V_{sum(1)}(t)$). Further, the first filter path 30 may include another low-pass filter instead of a signal attenuator. The low-pass filter in the first filter path 30 and the low-pass filter in the second filter path 32 may have a same or different order. Alternatively, the second filter path 32 may include another signal attenuator instead of a low-pass filter. When the first filter path 30 is conducted, the initial first filter output signal $V_{Filter1(1)}(t)$, which is an attenuated version of the initial summing output signal $V_{sum(1)}(t)$, is provided at the output terminal OUTc of the two-path filter structure 16. When the second filter path 32 is conducted, the initial second filter output signal $V_{Filter2(1)}(t)$, which is a low-pass filtered version of the initial summing output signal $V_{sum(1)}(t)$, is provided at the output terminal OUTc of the two-path filter structure 16. See mathematic details in Section C below.

The ADC 20 sequentially receives the initial first filter output signal $V_{Filter1(1)}(t)$ and the initial second filter output signal $V_{Filter2(1)}(t)$ through the filter buffer 18, and sequentially provides an initial first ADC output signal $V_{ADC1(1)}[n]$ based on the initial first filter output signal $V_{Filter1(1)}(t)$ and an initial second ADC output signal $V_{ADC2(1)}[n]$ based on the initial second filter output signal $V_{Filter2(1)}(t)$ (step 106). Herein, each of the initial first ADC output signal $V_{ADC1(1)}[n]$ and the initial second ADC output signal $V_{ADC2(1)}[n]$ includes distortions generated from both the main DAC 12 and the ADC 20. The filter buffer 18 may be an op-amp buffer. See mathematic details in Section D below.

After the initial first ADC output signal $V_{ADC1(1)}[n]$ and the initial second ADC output signal $V_{ADC2(1)}[n]$ are generated by the ADC 20 and transferred to the control system 22, an initial calibration input signal $C_{C(1)}(t)$ is generated and stored in the control system 22 (step 108). Herein, the control system 22 is configured to implement both control functions and calculation functions. For the control functions, the control system 22 is configured to generate the control signal CS that is used to selectively conduct the first filter path 30 and the second filter path 32 in the two-path filter structure 16. In addition, the control system 22 may be configured to turn off the calibration DAC 24 at the initial calibration iteration, such that the initial calibration DAC output signal $V_{outc(1)}(t)$ equals zero. For the calculation functions, the control system 22 is configured to separate the distortion from the main DAC 12 and the distortion from the ADC 20 based on the initial first ADC output signal $V_{ADC1(1)}[n]$ and the initial second ADC output signal $V_{ADC2(1)}[n]$, and configured to calculate the initial calibration input signal $C_{C(1)}(t)$ based on the distortion from the main DAC 12. Herein, the initial calibration input signal $C_{C(1)}(t)$ is also stored in the control system 22 and will be used to calculate a second calibration input signal $C_{C(2)}(t)$. See mathematic details in Section E below.

The control system 22 may include at least one computing device providing firmware, hardware, and/or executable software (such as C++, Matlab, etc.), such as a microcontroller, application specific integrated circuit (ASIC), a personal computer, a computation engine, and the like. In one embodiment, the control system 22 is a microcontroller, which implements both the control functions and the calculation functions, and is embedded in a same printed circuit board (PCB) or overall system as the main DAC 12, the ADC 20, and the calibration DAC 24. In one embodiment, the control system 22 is a computer, which implements both the control functions and the calculation functions, and is off the board, where the main DAC 12, the ADC 20, and the calibration DAC 24 are embedded. Further, in one embodiment, a first portion of the control system 22, which is configured to implement the control functions, may be a microcontroller, an ASIC, or a central processing unit (CPU). The first portion of the control system 22 is embedded in the same PCB board as the main DAC 12, the ADC 20, and the calibration DAC 24. A second portion of the control system 22, which is configured to implement the calculation functions, may be a computer and is off the PCB board, where the main DAC 12, the ADC 20, and the calibration DAC 24 are embedded.

At the end of the first iteration, the calibration DAC 24 receives the initial calibration input signal $C_{C(1)}(t)$ and generates the second calibration DAC output signal $V_{outc(2)}(t)$ based on the initial calibration input signal $C_{C(1)}(t)$ (step 110). The second calibration DAC output signal $V_{outc(2)}(t)$ will be used in the second calibration iteration. Further, the second calibration DAC output signal $V_{outc(2)}(t)$ may pass through a signal attenuator 34 before it is provided to the summing buffer structure 14. The signal attenuator 34 helps to reduce distortion introduced by the calibration DAC 24 itself. In this embodiment, the signal attenuator 34 may be a voltage divider. See mathematic details in Section F below.

At $i^{th}$ ($i \geq 2$) calibration iteration, the main DAC 12 receives an $i^{th}$ digital input signal $C_{in(i)}[n]$ and generates an $i^{th}$ main DAC output signal $V_{outM(i)}(t)$ (step 112). The $i^{th}$ digital input signal $C_{in(i)}[n]$ is an ideal digital sinusoidal/cosinusoidal signal with essentially no noise and distortion. The $i^{th}$ main DAC output signal $V_{outM(i)}(t)$ includes the distortion from the main DAC 12.

The summing buffer structure 14 then generates an $i^{th}$ summing output signal $V_{sum(i)}(t)$ by summing the main DAC output signal $V_{outM(i)}(t)$ and the calibration DAC output signal $V_{outc(i)}(t)$, which is provided by the calibration DAC 24 and generated in $(i-1)^{th}$ calibration iteration (step 114). Herein, the $i^{th}$ main DAC output signal $V_{outM(i)}(t)$ is provided to the first input terminal INb1 of the summing buffer structure 14, and the $i^{th}$ calibration DAC output signal $V_{outc(i)}(t)$ is provided to the second input terminal INb2 of the summing buffer structure 14. Since the $i^{th}$ calibration DAC output signal $V_{outC(i)}(t)$ includes the distortion information in the main DAC output signal $V_{outM}(t)$, the $i^{th}$ summing output signal $V_{sum(i)}(t)$ corrects at least a portion of the distortion in the $i^{th}$ main DAC output signal $V_{outM(i)}(t)$. If the $i^{th}$ summing output signal $V_{sum(i)}(t)$ achieves a desired purity-level (depending on different applications) and includes essentially no distortion from the main DAC 12 (at least 95% distortion in the $i^{th}$ main DAC output signal $V_{outM(i)}(t)$ has been eliminated), the $i^{th}$ summing output signal $V_{sum(i)}(t)$ may be used as a high-purity output signal of the signal generator 10. If the $i^{th}$ summing output signal $V_{sum(i)}(t)$ does not achieve the desired purity-level and still includes some distortion from the main DAC 12, the $i^{th}$ summing output signal $V_{sum(i)}(t)$ is provided to the two-path filter structure 16. The process will be iterated until the signal generator 10 is fully calibrated (at least 95% distortion in the main DAC output signal $V_{outM}(t)$ has been eliminated). See mathematic details in Section G below.

It is clear to those skilled in the art that even if the main DAC 12, the ADC 20 and the calibration DAC 24 are not ideal and have unneglectable nonlinearities, the signal generator 10 will still generate a high-purity output signal. The purity of the output signal of the signal generator 10 no longer relies on the performances of the main DAC 12, the ADC 20 and the calibration DAC 24. The output signal of the signal generator 10 (a certain summing output signal $V_{sum}(t)$) may have a much higher purity level than the original main DAC output signal $V_{outM}(t)$.

Next, the two-path filter structure 16 sequentially generates an $i^{th}$ first filter output signal $V_{Filter1(i)}(t)$ and an $i^{th}$ second filter output signal $V_{Filter2(i)}(t)$ based on the $i^{th}$ summing output signal $V_{sum(i)}(t)$ (step 116). When the first filter path 30 is conducted, the $i^{th}$ first filter output signal $V_{Filter1(i)}(t)$, which is an attenuated version of the $i^{th}$ summing output signal $V_{sum(i)}(t)$, is provided at the output terminal OUTc of the two-path filter structure 16. When the second filter path 32 is conducted, the $i^{th}$ second filter output signal $V_{Filter2(i)}(t)$, which is a low-pass filtered version of the $i^{th}$ summing output signal $V_{sum(i)}(t)$, is provided at the output terminal OUTc of the two-path filter structure 16.

The ADC 20 sequentially receives the $i^{th}$ first filter output signal $V_{Filter1(i)}(t)$ and the $i^{th}$ second filter output signal $V_{Filter2(i)}(t)$ through the filter buffer 18, and sequentially provides an $i^{th}$ first ADC output signal $V_{ADC1(i)}[n]$ and an $i^{th}$ second ADC output signal $V_{ADC2(i)}[n]$, respectively (step 118). At the $i^{th}$ calibration iteration, the $i^{th}$ main DAC output signal $V_{outM(i)}(t)$ is at least partially calibrated by the $i^{th}$ calibration DAC output signal $V_{outc(i)}(t)$, and consequently, the $i^{th}$ summing output signal $V_{sum(i)}(t)$ has less distortion from the main DAC 12 than the $i^{th}$ main DAC output signal $V_{outM(i)}(t)$. As such, each of the $i^{th}$ first ADC output signal $V_{ADC1(i)}[n]$ and the $i^{th}$ second ADC output signal $V_{ADC2(i)}[n]$ includes remaining distortion from the main DAC 12 in the $i^{th}$ summing output signal $V_{sum(i)}(t)$ and the distortion from the ADC 20.

After the $i^{th}$ first ADC output signal $V_{ADC1(i)}[n]$ and the $i^{th}$ second ADC output signal $V_{ADC2(i)}[n]$ are generated by the ADC 20 and transferred to the control system 22, an $i^{th}$ calibration input signal $C_{C(i)}(t)$ is generated and stored in the control system 22 (step 120). Herein, the control system 22 is configured to implement both the control functions and the calculation functions. For the control functions, the control system 22 is configured to generate the control signal CS that is used to selectively conduct the first filter path 30 and the second filter path 32 in the two-path filter structure 16. In addition, the control system 22 is also configured to turn on the calibration DAC 24, such that the calibration DAC output signal $V_{outC}(t)$ is allowed to feed back to the summing buffer structure 14. For the calculation functions, the control system 22 is configured to separate the remaining distortion from the main DAC 12 and the distortion from the ADC 20 based on the $i^{th}$ first ADC output signal $V_{ADC1(i)}[n]$ and the $i^{th}$ second ADC output signal $V_{ADC2(i)}[n]$. The $i^{th}$ calibration input signal $C_{C(i)}(t)$, which includes the distortion information in the $i^{th}$ main DAC output signal $V_{outM(i)}(t)$, is calculated by adding the $(i-1)^{th}$ calibration input signal $C_{C(i-1)}(t)$, which is stored in the control system 22, and an $i^{th}$ calibration update signal that represents the remaining distortion from the main DAC 12 in the $i^{th}$ summing output signal $V_{sum(i)}(t)$. In addition, the $i^{th}$ calibration input signal $C_{C(i)}(t)$ is stored in the control system 22 and will be used to calculate an $(i+1)^{th}$ calibration input signal $C_{C(i+1)}(t)$.

At the end of the $i^{th}$ calibration iteration, the calibration DAC 24 generates the $(i+1)^{th}$ calibration DAC output signal $V_{outc(i+1)}(t)$ based on the $i^{th}$ calibration input signal $C_{C(i)}(t)$ (step 122). The $(i+1)^{th}$ calibration DAC output signal $V_{outc(i+1)}(t)$ will be used in the $(i+1)^{th}$ calibration iteration. See mathematic details in Section G below.

Section A

At initial calibration iteration, the initial digital input signal $C_{in(1)}[n]$ is an ideal digital sinusoidal/cosinusoidal signal with essentially no noise and distortion, given by:

$$C_{IN(1)}[n] = \text{round}\left(\left(\frac{V_{RDAC}}{2} + |A|\cos(\omega_o n T_{SDAC} + \phi)\right) \times 2^{N_{DAC}}\right) \quad (1)$$

Where n=0, 1, 2 ... $M_{DAC}-1$, $M_{DAC}$ is the data record length of the initial digital input signal $C_{in(1)}[n]$. $T_{SDAC}$ stands for the sampling period of the main DAC 12.

$$|A| \leq \frac{V_{RDAC}}{2};$$

the main DAC 12 output range is [0 $V_{RDAC}$] and has resolution of $N_{DAC}$ bit; $\phi$ is the initial phase of initial digital input signal $C_{in(1)}[n]$, and $$f_{sig} = \frac{\omega_o}{2\pi}$$

is a frequency of the initial digital input signal $C_{in(1)}[n]$. If the main DAC 12 is ideal, the initial main DAC output signal $V_{outM(1)}(t)$ is given by:

$$V_{outM(1)}(t) = \frac{V_{RDAC}}{2} + |A|\cos(\omega_o t + \phi) + Q_{DAC} \quad (2)$$

where t∈[$nT_{sDAC}$, $(n+1)T_{sDAC}$], n=0, 1, 2 ... $M_{DAC}-1$, and $Q_{DAC}$ is a quantization error of the main DAC 12, given by:

$$Q_{DAC} = \text{round}\left(\left(\frac{V_{RDAC}}{2} + |A|\cos(\omega_o t + \phi)\right) \times 2^{N_{DAC}}\right) - \quad (3)$$
$$\frac{V_{RDAC}}{2} - |A|\cos(\omega_o t + \phi)\right)$$

In reality, noise and nonlinearities will be added to the initial main DAC output signal $V_{outM(1)}(t)$, given by:

$$V_{outM(1)}(t) = \quad (4)$$
$$\frac{V_{RDAC}}{2} + |A|\cos(\omega_o t + \phi) + Q_{DAC} + \sum_{k=2}^{+\infty} A_k \cos(k\omega_o t + \phi_k) + w(t)$$

where w(t) is the distortion of the main DAC 12, $A_k$ and $\phi_k$ are amplitude and initial phase of the $k^{th}$ harmonic, respectively. As such, if the resolution of the main DAC 12 is N-bit, the purity level of the main DAC output signal $V_{outM}(t)$ may only achieve (N−1)-bit or (N−2)-bit.

Section B

Since the initial calibration DAC output signal $V_{outc(1)}(t)$ equals zero, the initial summing output signal $V_{sum(1)}(t)$ is based on the initial main DAC output signal $V_{outM(1)}(t)$, given in exponential form:

$$V_{sum(1)}(t) = D_0 + \sum_{k=\pm 1}^{\pm H} |D_k| e^{jk\omega_o t} e^{j\phi_k} + W_{MDAC}(t) \quad (5)$$

where $$D_0 = \frac{V_{RDAC}}{2}, |D_1| = |D_{-1}| = \frac{|A|}{2}, |D_k| = |D_{-k}| = \frac{|A_k|}{2},$$

$\phi_1$, $\phi_k$ are fundamental's and $k^{th}$ harmonics phase, respectively. $W_{MDAC}(t)$ is the total noise including the quantization errors $Q_{DAC}$ and the distortion of the main DAC 12 and the summing buffer structure 14. k=1, 2, ... H, and first H harmonics are considered for analysis, assuming that higher order harmonics have negligible power. The initial summing output signal $V_{sum(1)}(t)$ does not correct the distortion in the initial main DAC output signal $V_{outM(1)}(t)$, because the calibration DAC 24 is turned off at the initial calibration iteration.

Section C

When the first filter path 30 is conducted, the first filter output signal $V_{Filter1(1)}(t)$, which is an attenuated version of the summing output signal $V_{sum(1)}(t)$, is given by:

$$V_{Filter1(1)}(t) = D + \sum_{k=\pm 1}^{\pm H} |D_k H_1(jk\omega_o)| e^{jk\omega_o t} e^{j(\phi_k + \varphi_k)} + W_1(t) \quad (6)$$

When the second filter path 32 is conducted, the second filter output signal $V_{Filter2(1)}(t)$, which is a low-pass filtered version of the summing output signal $V_{sum(1)}(t)$, is given by:

$$V_{Filter2(1)}(t) = D + \sum_{k=\pm 1}^{\pm H} |D_k H_2(jk\omega_o)| e^{jk\omega_o t} e^{j\cdot(\phi_k + \psi_k)} + W_2(t) \quad (7)$$

where D is the offset voltage, which is essentially the same for both the initial first filter output signal $V_{Filter1(1)}(t)$ and the initial second filter output signal $V_{Filter2(1)}(t)$. $W_1(t)$ is a sum of $w_{MDAC}(t)$ and harmonic noise of the first filter path 30. $W_2(t)$ is a sum of $W_{MDAC}(t)$ and harmonic noise of the second filter path 32. Once the filter structure is known, the harmonic noise of the first filter path 30 and the harmonic noise of the second filter path 32 are known. The frequency response of the filters are $H_1(j\omega)$ and $H_2(j\omega)$, respectively:

$$H_1(j\omega) = |H_1(j\omega)| e^{\varphi(\omega)} \quad (8)$$

$$= \frac{R_3 \| R_4}{R_1 + R_2 + R_3 \| R_4} \quad (9)$$

$$H_2(j\omega) = |H_2(j\omega)| e^{\psi(\omega)} \quad (10)$$

$$= \frac{1}{\left(\frac{R_1}{R_4} + \frac{R_2}{R_4} + 1\right) + j\omega \cdot \left[\begin{array}{l} R_1 C_1\left(\frac{R_2}{R_4} + 1\right) \\ + C_2(R_1 + R_2) \end{array}\right] + (j\omega)^2 R_1 R_2 C_1 C_2} \quad (11)$$

Herein, the capacitors C1~C2 and the resistors R1~R3 in the two-path filter structure 16 and an output resistor R4 adjacent to the output terminal OUTc of the two-path filter structure 16 need to be chosen carefully, such that the initial first filter output signal $V_{Filter1(1)}(t)$ and the initial second filter output signal $V_{Filter2(1)}(t)$ have essentially the same amplitude (at most 5% amplitude difference). In addition, the capacitors C1~C2 and the resistors R1~R3 in the two-path filter structure 16 and the output resistor R4 are required to have superior linearity performance.

Section D

With amplitude matched between the initial first filter output signal $V_{Filter1(1)}(t)$ and the initial second filter output signal $V_{Filter2(1)}(t)$, the initial first ADC output signal $V_{ADC1(1)}[n]$ and the initial second ADC output signal $V_{ADC2(1)}[n]$ are given by:

$$V_{ADC1(1)}[n] = D + \sum_{k=\pm 1}^{\pm H} |D_k H_1(jk\omega_o)| e^{jk\omega_o nT_{sADC}} e^{j\cdot(\phi_k + \varphi_k)} + \quad (12)$$
$$\sum_{k=\pm 2}^{\pm H} |HD_k| e^{jk\omega_o nT_{sADC}} e^{j\cdot k(\phi_1 + \varphi_1) + \gamma_k} + W_{ADC1}[n]$$

$$V_{ADC2(1)}[n] = D + \sum_{k=\pm 1}^{\pm H} |D_k H_2(jk\omega_o)| e^{jk\omega_o nT_{sADC}} e^{j\cdot(\phi_k + \psi_k)} + \quad (13)$$
$$\sum_{k=\pm 2}^{\pm H} |HD_k| e^{jk\omega_o nT_{sADC}} e^{j\cdot k(\phi_1 + \psi_1) + \gamma_k} + W_{ADC2}[n]$$

where $W_{ADC1}[n]$ is a total noise of $W_1(t)$ and noise of the ADC 20 based on the first filter output signal $V_{Filter1}(t)$, and $W_{ADC2}[n]$ is a total noise of $W_2(t)$ and noise of the ADC 20 based on the first filter output signal $V_{Filter2}(t)$. Since the initial first filter output signal $V_{Filter1(1)}(t)$ and the initial second filter output signal $V_{Filter2(1)}(t)$ are amplitude matched and the initial first filter output signal $V_{Filter1(1)}(t)$ and the initial second filter output signal $V_{Filter2(1)}(t)$ pass through the same filter buffer 18 and the ADC 20, the initial first ADC output signal $V_{ADC1(1)}[n]$ and the initial second ADC output signal $V_{ADC2(1)}[n]$ are also amplitude matched.

Section E

In order to generate the initial calibration DAC input signal $C_{C(1)}(t)$ properly, which only includes distortion information about the main DAC 20, the initial first ADC output signal $V_{ADC1(1)}[n]$ and the initial second ADC output signal $V_{ADC2(1)}[n]$ need to be phase matched. The phase shift between the initial first ADC output signal $V_{ADC1(1)}[n]$ and the initial second ADC output signal $V_{ADC2(1)}[n]$ is due to different filter transfer functions of the first filter path 30 and the second filter path 32.

To achieve the best phase matching possible, a first couple of consecutive points of the initial first ADC output signal $V_{ADC1(1)}[n]$ are chosen (herein five points are chosen), given by $x_1[1]$, $x_1[2]$, $x_1[3]$, $x_1[4]$, $x_1[5]$, and a same length of consecutive points of the initial second ADC output signal $V_{ADC2(1)}[n]$ are chosen, given by $x_2[i]$, $x_2[i+1]$, $x_2[i+3]$, $x_2[i+4]$. These points ($x_1[1]$, $x_1[2]$, $x_1[3]$, $x_1[4]$, $x_1[5]$, $x_2[i]$, $x_2[i+1]$, $x_2[i+3]$, $x_2[i+4]$) need to be chosen from the data points that are settled, which means the initial data points that are in transient process will be discarded. The best matching between $x_1[1]$, $x_1[2]$, $x_1[3]$, $x_1[4]$, $x_1[5]$ and $x_2[i]$, $x_2[i+1]$, $x_2[i+3]$, $x_2[i+4]$, may be found by minimizing the square root mean:

$$\sqrt{\begin{array}{l}(x_2[i] - x_1[1])^2 + (x_2[i+1] - x_1[2])^2 + (x_2[i+2] - x_1[3])^2 + \\ (x_2[i+3] - x_1[4])^2 + (x_2[i+4] - x_1[5])^2\end{array}}\bigg|_{Min} \quad (14)$$

After the index i is found, the initial filter output signal $V_{Filter2(1)}(t)$ will start from i to the end M, with a total data record length M−1+1. Also, the initial first filter output signal $V_{Filter1(1)}(t)$ will be shortened to data record length M−1+1, from 1 to M−i+1. An updated initial first ADC output signal $V_{ADC1(1)}[n]$ based on the shortened initial first filter output signal $V_{Filter1(1)}(t)$ and an updated initial second ADC output signal $V_{ADC2(1)}[n]$ based on the shortened initial second filter output signal $V_{Filter2(1)}(t)$ are given by:

$$V_{ADC1(1)}[n] = D + |D_1 H_1(j\omega_o)| e^{j\omega_o nT_{sADC}} e^{j\cdot(\phi_1 + \varphi_1)} + \quad (15)$$
$$|D_{-1} H_1(-j\omega_o)| e^{-j\omega_o nT_{sADC}} e^{j\cdot(\phi_1 + \varphi_1)} +$$
$$\sum_{k=\pm 2}^{\pm H} |D_k H_1(jk\omega_o)| e^{jk\omega_o nT_{sADC}} e^{j\cdot(\phi_k + \varphi_k)} +$$
$$\sum_{k=\pm 2}^{\pm H} |HD_k| e^{jk\omega_o nT_{sADC}} e^{j\cdot k(\phi_1 + \varphi_1) + \gamma_k} + W_{ADC1}[n]$$

$$V_{ADC2(1)}[n] = D + |D_1 H_2(j\omega_o)| e^{j\omega_o nT_{sADC}} e^{j\cdot(\phi_1 + \varphi_1)} + \quad (16)$$
$$|D_{-1} H_2(-j\omega_o)| e^{-j\omega_o nT_{sADC}} e^{j\cdot(\phi_1 + \varphi_1)} +$$
$$\sum_{k=\pm 2}^{\pm H} |D_k H_2(jk\omega_o)| e^{jk\omega_o nT_{sADC}} e^{j\cdot(\phi_k + \psi_k + k\cdot(\varphi_1 - \psi_1))} +$$
$$\sum_{k=\pm 2}^{\pm H} |HD_k| e^{jk\omega_o nT_{sADC}} e^{j\cdot k(\phi_1 + \varphi_1) + \gamma_k} + W_{ADC2}[n]$$

Herein, since the shortened initial first filter output signal $V_{Filter1(1)}(t)$ and the shortened initial second filter output signal $V_{Filter2(1)}(t)$ are matched in both amplitude and phase and pass through the same filter buffer 18 and the ADC 20, a nonlinearity error, which is caused by the ADC 20, in the initial first ADC output signal $V_{ADC1(1)}[n]$ and a nonlinearity error, which is caused by the ADC 20, in the initial second ADC output signal $V_{ADC2(1)}[n]$ are essentially the same.

After identification, an estimated fundamental from the ADC 20 is given by:

$$\hat{V}_{Fund}[n] = \hat{A}\sin\left(\frac{2\pi(J_{int}+\hat{\delta})}{M}n + \hat{\phi}\right) + \hat{V}_{os} \quad (17)$$

where $J_{int}$ stands for the integer part of sampled periods, $\hat{\delta}$ is the estimated fractional part of sampled periods, $\hat{A}$ is the estimated fundamental amplitude, $\hat{\phi}$ is the estimated initial phase and $\hat{V}_{os}$ is the estimated DC offset.

After the fundamental in the initial first ADC output signal $V_{ADC1(1)}[n]$ and the fundamental in the initial second ADC output signal $V_{ADC2(1)}[n]$ are estimated, they are subtracted from the initial first ADC output signal $V_{ADC1(1)}[n]$ and the initial second ADC output signal $V_{ADC2(1)}[n]$, respectively.

$$r_1[n] = V_{ADC1(1)}[n] - \hat{V}_{Fund}[n] \quad (18)$$

$$r_2[n] = V_{ADC2(1)}[n] - \hat{V}_{Fund}[n] \quad (19)$$

Since the initial first ADC output signal $V_{ADC1(1)}[n]$ and the initial second ADC output signal $V_{ADC2(1)}[n]$ have the same ADC nonlinearities, when subtracting two residues, the ADC nonlinearities are subtracted, leaving only DAC's nonlinearities.

$$R_3[n] = r_1[n] - r_2[n] \quad (20)$$

Now in $R_3[n]$, it can be viewed as summations of a fundamental and harmonics in the form of sines and cosines. By using least square again, without the error introduced by the leakage of the fundamental, the accurate estimation of each harmonic component can be obtained similarly. The estimated harmonics are given by:

$$xh_2[n] = \sum_{k=2}^{H}\left[\begin{array}{c}\hat{a}_k\cos\left(2\pi k\frac{J_{int}+\hat{\delta}}{M}n\right) \\ +\hat{b}_k\sin\left(2\pi k\frac{J_{int}+\hat{\delta}}{M}n\right)\end{array}\right] \quad (21)$$

The estimated $k^{th}$ harmonic component is given by:

$$\left|\sqrt{\hat{a}_k^2 + \hat{b}_k^2}\right|e^{j\theta_k},$$

where $$\theta_k = \tan^{-1}\left(\frac{\hat{b}_k}{\hat{a}_k}\right).$$

By subtracting (15) and (16) from (6) and (7), respectively, the ADC 20 introduced errors are subtracted, so do the fundamental and DC components, leaving only subtractions of nonlinearities from the two outputs of the ADC 20. For k=2, 3 . . . H, each $k^{th}$ nonlinearity subtraction is obtained by $$\left|\sqrt{\hat{a}_k^2 + \hat{b}_k^2}\right|e^{j\theta_k}$$

derived above. Ignoring the noise effect, and by re-arranging terms, the nonlinearity of the main DAC 12 can therefore be estimated:

$$2|\hat{D}_k|e^{j\hat{\phi}_k} = \frac{\left|\sqrt{\hat{a}_k^2 + \hat{b}_k^2}\right|e^{j\theta_k}}{\left|\hat{H}_1(jk\omega_o)\right|e^{j(\hat{\psi}_k - k\hat{\psi}_1)} - \left|\hat{H}_2(jk\omega_o)\right|e^{j(\hat{\psi}_k - k\hat{\psi}_1)}} \quad (22)$$

where $k^{th}$ DAC's harmonic amplitude and phase is $2|\hat{D}_k|$, $\hat{\phi}_k$.

The initial calibration input signal $C_{C(1)}(t)$ will be the estimated nonlinearity of the main DAC 12, multiplied by the estimated attenuation factor 6

$$C_{CC(1)}[n] = \text{round}\left(\left(\begin{array}{c}-\hat{G}\times\sum_{k=2}^{H}2|\hat{D}_k|\cos(k\omega_o nT_{sDAC}+\hat{\phi}_k) \\ +\frac{V_{RDAC}}{2}\end{array}\right)\times 2^{N_{DAC}}\right) \quad (23)$$

Similar to the initial main DAC output signal $V_{outM(1)}(t)$, the second calibration DAC output signal $V_{outc(2)}(t)$, which will be used in the second calibration iteration, is given by:

$$V_{outC(2)}(t) \approx \frac{V_{RDAC}}{2} + (-\hat{G})\times\sum_{k=2}^{H}2|\hat{D}_k|\cos(k\omega_o t+\hat{\phi}_k) + \sum_{k=2}^{H}A_{CDACk}\cos(k\omega_o t+\phi_{CDACk}) + w_{CDAC}(t) \quad (24)$$

where $w_{CDAC}(t)$ contains a noise and quantization error of the calibration DAC 24.

After the signal attenuator 34, the attenuated calibration DAC output is given by:

$$V_{outC\_att(2)}(t) = D_C - \frac{\hat{G}}{G}\times\sum_{k=\pm 2}^{\pm H}|\hat{D}_k|e^{jk\omega_o t}e^{j\hat{\phi}_k} + E_{CDAC}(t)/G \quad (25)$$

$$E_{CDAC}(t) = \sum_{k=2}^{H}A_{CDACk}\cos(k\omega_o t+\phi_{CDACk}) + W_{CDAC}(t) \quad (26)$$

As can be seen from eq. (25), the error introduced by the calibration DAC 24 is attenuated by the factor of G, the error introduced by the calibration DAC 24 itself will be small enough, and may be neglected. One thing to be mentioned is that the attenuation needs to be controlled to some level so that the calibration input signal $C_{C(1)}(t)$ range will near the full range of the calibration DAC input. However, if the attenuation factor G is too large, the calibration DAC input will be clipped, which will lead to the wrong output and not only will the nonlinearities of the main DAC not be cancelled, but will also introduce extra distortions to the combined signal.

Section G

The second summing output signal $V_{sum(2)}(t)$ is given by:

$$V_{sum(2)}(t) = D_0 - D_C + |D_1|(e^{j \cdot k\omega_o t} + e^{-j \cdot k\omega_o t})e^{j\phi_k} + \quad (27)$$

$$\sum_{k=\pm 2}^{\pm H} \left( |D_k| e^{j \cdot k\omega_o t} e^{j\phi_k} - (1+GE_F) \times \left(-\frac{\hat{G}}{G}\right) \times |\hat{D}_k| e^{j \cdot k\omega_o t} e^{j\hat{\phi}_k} \right) +$$

$$W_{MDAC}(t) - E_{CDAC}(t)/G$$

Once the digital input signal $C_{in}[n]$ is fed into the main DAC 12 and the signal generator 10 is turned on accordingly, the whole iteration of generating the calibration input signal $C_C[n]$ may be automatically performed to produce ultra-pure sine/cos wave. Therefore, the signal generator 10 is capable of self-calibration. If the $2^{nd}$ summing output signal $V_{sum(2)}(t)$ achieves a desired purity-level (depending on different applications) and includes essentially no distortion from the main DAC 12, the $2^{nd}$ summing output signal $V_{sum(2)}(t)$ may be used as a high-purity output signal of the signal generator 10. If the $2^{nd}$ summing output signal $V_{sum(2)}(t)$ does not achieve the desired purity-level and still includes some distortion from the main DAC 12, more iterations may be used to improve the signal purity.

Section H

In this section, mathematical analysis will be shown to demonstrate that the iteration process is guaranteed to converge and the nonlinearity of the main DAC 12 will eventually be calibrated, which is only limited by noise.

Let $HD_{k,i}$ stand for $k^{th}$ input harmonic distortion in $i^{th}$ iteration (i=1, 2, . . . ). At $1^{st}$ iteration, the true value of $k^{th}$ input harmonic distortion is: $HD_{k,1} = |D_k| e^{j \cdot k\omega_o t} e^{j\Phi_k}$. And the estimated $k^{th}$ input harmonic distortion is given by:

$$HD_{k,1} = |\hat{D}_{k,1}| e^{j\hat{\phi}_{k,1}} \quad (28)$$

$$= \frac{\left|\sqrt{\hat{a}_{k,1}^2 + \hat{b}_{k,1}^2}\right| e^{j\hat{\theta}_{k,1}}}{2\left(|\hat{H}_1(jk\omega_o)| e^{j(\hat{\varphi}_k - k\hat{\varphi}_1)} - |\hat{H}_2(jk\omega_o)| e^{j(\hat{\psi}_k - k\hat{\psi}_1)}\right)} \quad (29)$$

At $2^{nd}$ iteration, the true value of $k^{th}$ input harmonic distortion is given by:

$$HD_{k,2} = HD_{k,1} - \frac{\hat{G}}{G} \times HD_{k,1} + \frac{|D_{CDACk}| e^{j \cdot k\omega_o t} e^{j\phi_{CDACk}}}{G} \quad (30)$$

Therefore, at $(i+1)^{th}$ iteration, the $k^{th}$ harmonic distortion is:

$$HD_{k,i+1} = HD_{k,i} - \frac{\hat{G}}{G} \times HD_{k,i} + \frac{|D_{CDACk}| e^{j \cdot k\omega_o t} e^{j\phi_{CDACk}}}{G} \quad (31)$$

Assume
$$HD_{k,i} = \square HD_{k,i} + \Delta HD_{k,i} \quad (32)$$

where $\Delta HD_{k,i}$ contain the $i^{th}$ iteration's estimation. Then eq. (31) can be rewritten as:

$$HD_{k,i+1} = \left(1 - \frac{\hat{G}}{G}\right) HD_{k,i} + \frac{\hat{G} \cdot \Delta HD_{k,i} + |D_{CDACk}| e^{j \cdot k\omega_o t} e^{j\phi_{CDACk}}}{G} \quad (33)$$

$HD_{k,i}$ can also be given by:

$$HD_{k,i} = \quad (34)$$

$$\frac{\left|\sqrt{a_{k,i}^2 + b_{k,i}^2}\right| e^{j\theta_{k,i}}}{2(|H_1(jk\omega_o)| e^{j(\varphi_k - k\varphi_1)} - |H_2(jk\omega_o)| e^{j(\psi_k - k\psi_1)})} + W_{HD\_ADC+N}$$

where $W_{HD\_ADC+N}$ contains the ADC harmonics and noise subtraction between two ADC outputs, and error from true and estimated filters values.

On the numerator, $$\left|\sqrt{a_{k,i}^2 + b_{k,i}^2}\right| e^{j\theta_{k,i}}$$

is linearly proportional to $HD_{k,i}$, let:

$$\left|\sqrt{a_{k,i}^2 + b_{k,i}^2}\right| e^{j\theta_{k,i}} = \beta \cdot HD_{k,i},$$

and $$\frac{1}{\alpha} = 2(|H_1(jk\omega_o)| e^{j(\varphi_k - k\varphi_1)} - |H_2(jk\omega_o)| e^{j(\psi_k - k\psi_1)}),$$

which is independent of iterations. Similarly, let $\alpha = \hat{\alpha} + \Delta\alpha$, $\beta = \hat{\beta} + \Delta\beta$. $\Delta\alpha$ contains the estimation error from a slight inequality of two outputs ADC nonlinearity; $\Delta\beta$ contains the estimation error from FIRE and Least Square computational errors. Then eq. (34) can be written as:

$$HD_{k,i} = \alpha \cdot \beta \cdot HD_{k,i} + W_{HD\_ADC+N} \quad (35)$$

$$\approx HD_{k,i} + (\Delta\alpha + \Delta\beta) \cdot HD_{k,i} + W_{HD\_ADC+N} \quad (36)$$

Plugging eq. (36) into eq. (33), $$|HD_{k,i+1}| = \left|\frac{\Delta G + \hat{G} \cdot (\Delta\alpha + \Delta\beta)}{G}\right| \cdot |HD_{k,i}| + \quad (37)$$

$$\left|\frac{\hat{G} \cdot W_{HD\_ADC+N} + |D_{CDACk}| e^{j \cdot k\omega_o t} e^{j\phi_{CDACk}}}{G}\right|$$

where $$0 < \left|\frac{\Delta G + \hat{G} \cdot (\Delta\alpha + \Delta\beta)}{G}\right| 1,$$

and $$\varepsilon = \left|\frac{\hat{G} \cdot W_{HD\_ADC+N} + |D_{CDACk}| e^{j \cdot k\omega_o t} e^{j\phi_{CDACk}}}{G}\right|$$

is the small error term due to various error sources mentioned earlier. Therefore, $$\lim_{i \to \infty} |HD_{k,i}| = \varepsilon \tag{38}$$

It demonstrates that as the iteration process continues, eventually the source nonlinearity will be calibrated and converge.

Those skilled in the art will recognize improvements and modifications to the preferred embodiments of the present disclosure. All such improvements and modifications are considered within the scope of the concepts disclosed herein and the claims that follow.

What is claimed is:

1. A signal generator comprising:
   a main digital-to-analog converter (DAC) providing a main DAC output signal with main DAC distortion;
   a calibration DAC providing a calibration DAC output signal, which includes information about the main DAC distortion;
   a summing buffer structure configured to sum the main DAC output signal and the calibration DAC output signal and provide a summing output signal, which corrects at least a portion of the main DAC distortion;
   a two-path filter structure including a first filter path and a second filter path, wherein:
      when the first filter path is conducted, the two-path structure is configured to provide a first filter output signal based on the summing output signal; and
      when the second filter path is conducted, the two-path structure is configured to provide a second filter output signal based on the summing output signal;
   an analog-to-digital converter (ADC) providing a first ADC output signal based on the first filter output signal and providing a second ADC output signal based on the second filter output signal; and
   a control system coupled between the ADC and the calibration DAC, wherein:
      the control system is configured to provide a calibration DAC input signal to the calibration DAC to update the calibration DAC output signal, wherein the updated calibration DAC output signal includes updated information about the main DAC distortion; and
      the calibration DAC input signal is calculated from the first ADC output signal and the second ADC output signal.

2. The signal generator of claim 1 wherein the summing output signal corrects at least 95% of the main DAC distortion.

3. The signal generator of claim 1 wherein the control system includes at least one of a group consisting of a microcontroller, application specific integrated circuit (ASIC), and a computer.

4. The signal generator of claim 1 wherein the control system is embedded in a same printed circuit board (PCB) as the main DAC, the ADC, and the calibration DAC.

5. The signal generator of claim 1 wherein the control system is off a PCB board, in which the main DAC, the ADC, and the calibration are embedded.

6. The signal generator of claim 1 wherein the control system includes a first portion and a second portion, wherein:
   a first portion of the control system is embedded in a same PCB as the main DAC, the ADC, and the calibration DAC; and
   a second portion of the control system is off the PCB board.

7. The signal generator of claim 1 wherein the control system is configured to selectively conduct the first filter path and the second filter path.

8. The signal generator of claim 1 wherein the summing buffer structure comprises a summing unit and an operational amplifier (op-amp) buffer coupled to the summing unit, wherein the summing unit is configured to receive the main DAC output signal and the calibration DAC output signal and the op-amp buffer is configured to provide the summing output signal.

9. The signal generator of claim 1 further comprising a filter buffer coupled between the two-path filter structure and the ADC.

10. The signal generator of claim 9 wherein the filter buffer is an op-amp buffer.

11. The signal generator of claim 1 wherein the first filter path comprises a low-pass filter and the second filter path comprises a signal attenuator.

12. The signal generator of claim 11 wherein the signal attenuator is frequency independent.

13. The signal generator of claim 11 wherein the signal attenuator is frequency dependent.

14. The signal generator of claim 1 wherein the first filter path comprises a first signal attenuator and the second filter path comprises a second signal attenuator, wherein the first signal attenuator and the second signal attenuator are different.

15. The signal generator of claim 1 wherein the first filter path comprises a first low-pass filter and the second filter path comprises a second low-pass filter, wherein the first low-pass filter and the second low-pass filter are different.

16. The signal generator of claim 1 wherein the first low-pass filter and the second low-pass filter have a same order.

17. The signal generator of claim 1 wherein the first low-pass filter and the second low-pass filter have different orders.

18. The signal generator of claim 1 further comprises a signal attenuator coupled between the calibration DAC and the summing buffer structure.

19. The signal generator of claim 18 wherein the signal attenuator is a voltage divider.

20. The signal generator of claim 1 wherein the main DAC, the calibration DAC, and the ADC have a same resolution.

21. The signal generator of claim 1 wherein the main DAC, the calibration DAC, and the ADC have different resolutions.

22. A method comprising:
   generating a main digital-to-analog converter (DAC) output signal by a main DAC, wherein the main DAC output signal has main DAC distortion;
   generating a summing output signal by a summing buffer structure, wherein the summing output signal is generated based on the main DAC output signal and a calibration DAC output signal that equals to zero;
   sequentially generating a first filter output signal and a second filter output signal by a two-path filter structure that includes a first filter path and a second filter path, wherein the first filter output signal is generated when the first filter path is conducted, and the second filter output signal is generated when the second filter path is conducted;

sequentially generating a first analog-to-digital converter (ADC) output signal and a second ADC output signal by an ADC, wherein:
- the first ADC output signal is generated based on the first filter output signal, and the second ADC output signal is generated based on the second filter output signal; and
- each of the first ADC output signal and the second ADC output signal includes both the main DAC distortion and ADC distortion from the ADC;

generating a calibration DAC input signal by a control system, wherein the calibration DAC input signal includes information about the main DAC distortion;

updating the calibration DAC output signal by the calibration DAC, wherein the updated calibration DAC output signal is calculated based on the calibration DAC input signal; and calibrating the main DAC output signal with the updated calibration DAC output signal to correct at least a portion of the main DAC distortion.

23. The method of claim 22 wherein generating the calibration DAC input signal is provided by:

separating the main DAC distortion and the ADC distortion based on the first ADC output signal and the second ADC output signal; and calculating the calibration DAC input signal based on the main DAC distortion.

24. The method of claim 22 wherein the main DAC output signal and the updated calibration DAC output signal have inverted phases.

25. The method of claim 22 further comprising selectively conducting the first filter path and the second filter path by the control system.

26. The method of claim 22 wherein generating the calibration DAC input signal is implemented by a first portion of the control system, which is a microcontroller embedded in a same PCB as the main DAC, the ADC, and the calibration DAC.

27. The method of claim 22 wherein generating the calibration DAC input signal is implemented by a first portion of the control system, which is a computer off a PCB that the main DAC, the ADC, and the calibration are embedded in.

* * * * *